United States Patent [19]

Myles et al.

[11] 3,954,525

[45] May 4, 1976

[54] HOT-PRESSED SOLID DIFFUSION SOURCES FOR PHOSPHORUS

[75] Inventors: Thomas A. Myles, Tonawanda Township; Curtis E. Zimmer, Youngstown, both of N.Y.

[73] Assignee: The Carborundum Company, Niagara Falls, N.Y.

[22] Filed: Dec. 4, 1974

[21] Appl. No.: 529,656

Related U.S. Application Data

[63] Continuation-in-part of Ser. No. 500,765, Aug. 26, 1974.

[52] U.S. Cl. .............................. 148/189; 252/950; 252/951; 264/54; 106/69
[51] Int. Cl.² ........................................ H01L 7/44
[58] Field of Search ............. 252/950, 951; 264/54; 148/189; 106/69

[56] References Cited
UNITED STATES PATENTS

| | | | |
|---|---|---|---|
| 3,314,833 | 4/1967 | Arndt et al. ................... | 148/187 X |
| 3,540,951 | 11/1970 | Pammer et al. ................. | 148/186 X |
| 3,751,309 | 8/1973 | Derick et al. ................... | 252/950 X |
| 3,841,927 | 10/1974 | Florence et al. ................ | 148/189 |
| 3,849,344 | 11/1974 | McMurtry et al. ............. | 423/335 X |
| 3,852,086 | 12/1974 | Murata et al. .................. | 106/69 |
| B351,348 | 1/1975 | Venkatu ........................ | 148/189 |

*Primary Examiner*—G. Ozaki
*Attorney, Agent, or Firm*—David E. Dougherty; Raymond W. Green; Herbert W. Mylius

[57] ABSTRACT

Solid diffusion sources for phosphorus doping comprise from 10 to 95 percent $SiP_2O_7$ with an inert phase of $ZrP_2O_7$. Such materials may be hot-pressed to obtain diffusion source wafers of the appropriate dimensions and porosity. A preferred composition comprises from 25 to 75 weight percent $SiP_2O_7$, the balance $ZrP_2O_7$. Fabrication parameters range from about 750 psi to about 6,000 psi pressure during hot-pressing, at temperatures from about 800°C to about 1450°C.

3 Claims, No Drawings

HOT-PRESSED SOLID DIFFUSION SOURCES FOR PHOSPHORUS

This is a continuation-in-part of Ser. No. 500,765, filed Aug. 26, 1974.

BACKGROUND OF THE INVENTION

In the manufacture of semiconductor devices such as microwave transistors and silicon integrated circuits, shallow phosphorus diffusion in semiconductor silicon has become important. The characterization of semiconductor bodies is influenced substantially by diffusion profiles, especially from the emitter of a n-p-n structure, and the profiles are further dependent upon the diffusion source used. Up to the present time, liquid diffusion sources have been chiefly utilized in the diffusion process since satisfactory solid phosphorus diffusion sources have not been widely available. The liquid sources which have been employed are compounds such as phosphine ($PH_3$), phosphorus pentoxide ($P_2O_5$), phosphorus oxychloride ($POCl_3$) and phosphorus chlorides ($PCl_3$ and $PCl_5$). Of these liquid sources, $POCl_3$ and $PH_3$ have most frequently been used. These five phosphorus compounds are all low melting-point substances and have liquid or gas phases at temperatures below 650°C.

Conventional doping methods for phosphorus diffusion as performed with liquid diffusion sources are, briefly, as follows. One of the compounds listed above is heated at a low temperature, below 650°C, and the phosphorus gas and/or phosphorus compound gas thus developed is introduced into a doping chamber kept at a high temperature, ranging from 850°C to 1200°C. In this chamber the silicon wafers to be doped are arranged perpendicular to the phosphorus gas flow. In this method, the carrier concentration of phosphorus, p-n junction depth, and other electronic properties of the doped wafer are primarily influenced by the reaction condition between phosphorus gas and the solid silicon wafer. This reaction is further influenced by the flow rate of gas. When a uniform diffusion layer is required, a uniform flow of gas is necessary, which is quite difficult to establish. As a result, uniform diffusion of phosphorus in terms of each silicon wafer is difficult to control. This is one of the shortcomings of conventional phosphorus doping methods using liquid diffusion sources. Another deficiency of the liquid diffusion source method is inconvenience due to the dangerous nature of the liquid sources. Phosphine, phosphorus oxychloride and many other phosphorus compounds are toxic, corrosive, flammable or explosive.

While liquid diffusion sources continue to be used for the treatment or doping of semiconductor materials, the disadvantages of irregular diffusion control and high toxicity must be overcome to give a satisfactory diffusion procedure. An effective phosphorus diffusion or doping procedure for semiconductor silicon should provide: (1) a shallow phosphorus doping in silicon; (2) the doping procedure should not be complicated and should have a high reproducibility and reliability; (3) the doping procedure should be safe, even if personnel are exposed to exhaust gas during doping; (4) the diffusion sources should be economically reusable for many doping runs; and (5) a solid form of dopant source material should be utilized for greater safety, ease of handling, and convenience in use.

A number of solid diffusion sources have been developed in the past. Examples of such sources are indicated by U.S. Pat. No. 3,540,951, issued Nov. 17, 1970; U.S. Pat. No. 3,473,980, issued Oct. 21, 1969; and copending U.S. patent applications Ser. No. 239,897, filed Mar. 31, 1972, by McMurtry and Murata, now U.S. Pat. No. 3,849,344; and Ser. No. 374,706, filed June 28, 1973, by Murata and McMurtry, now U.S. Pat. No. 3,852,086.

In addition, prior doping techniques have included application of a doping or donor composition directly to the surface of a semiconducting material. Examples of these techniques include U.S. Pat. No. 3,514,348, issued May 26, 1970; U.S. Pat. No. 3,630,793, issued Dec. 28, 1971; U.S. Pat. No. 3,354,005, issued Nov. 21, 1967; and U.S. Pat. No. 2,794,846, issued June 4, 1957. Such techniques have suffered from a number of faults, including non-uniformity of doping and difficulty of control of dopant concentrations and junction depth.

The method of the present invention provides solid phosphorus diffusion sources, which are non-toxic, convenient, uniform, and which may be used in a standard dopant diffusion apparatus to give precise control of the diffusion treatment of semiconductor materials.

SUMMARY OF THE INVENTION

This invention relates to a method for the preparation of a semiconductor doping composition which comprises silicon pyrophosphate, $SiP_2O_7$, and the inert refractory additive zirconium pyrophosphate, $ZrP_2O_7$. The composition is formed into suitable solid diffusion sources by a hot-pressing technique, employing pressures of from 750 to 6,000 psi, and temperatures of from 800°C to about 1450°C, dependent upon composition and desired end usage. A preferred composition comprises about 50 percent by weight $SiP_2O_7$ and about 50 percent $ZrP_2O_7$. When the hot-pressed compositions are cut into suitable shapes, they give easily handled and economical solid, phosphorus sources for diffusion doping of silicon semiconductor bodies.

DETAILED DESCRIPTION OF THE INVENTION

The solid phosphorus-containing diffusion sources of this invention are prepared in the form of thin circular disks by hot-pressing a blend of finely divided particles of $SiP_2O_7$ and $ZrP_2O_7$, at a suitably elevated temperature and pressure. The body thus formed comprises essentially pure $SiP_2O_7$ with an inert phase of essentially pure $ZrP_2O_7$. The formed hot-pressed body is then cut, using known methods such as diamond sawing, to the desired disc thickness.

It has been found quite necessary to minimize any presence of the compound $Si_2P_2O_9$ [$(SiO_2)_2.P_2O_5$] to obtain a porous body having the necessary structural integrity and sourcing capability. In the past, phosphorus doping sources have been prepared using $SiP_2O_7$ (with or without $Si_2P_2O_9$), with a high melting additive material, such as zirconium oxide, which has a melting point in excess of 2000°C. Such materials were prepared in accordance with the teachings of U.S. patent application Ser. No. 374,706, filed June 28, 1973, now U.S. Pat. No. 3,852,086 by hot-pressing a slug of blended particles and cutting, such as with a diamond saw, to the desired thickness.

$SiP_2O_7$ and $ZrP_2O_7$ can be prepared as disclosed in copending U.S. patent application Ser. No. 548,118, filed Feb. 7, 1975, by Myles and Zimmer.

The bodies of diffusion material of the present invention may be fabricated in graphite molds, using hot-pressing techniques. Fabrication may be done at temperatures ranging from about 800° to 1450°C and under pressure ranging from about 750 to 6000 psi. Holding times in the molds may range from about 15 minutes to 10 hours and the fabrication may be carried out in air, under inert atmospheres such as nitrogen or argon, or under vacuums up to $10^{-7}$ Torr. The choice of fabrication conditions is, of course, governed by the composition of the starting materials used and the conditions under which the resulting diffusion material will be used.

For example, suitable hot-pressing conditions for a composition comprising 50 $SiP_2O_7$ and 50 $ZrP_2O_7$ are found to be 1200°C, at 2600 psi, for 30 minutes in an argon atmosphere. Time, temperature, and pressure are the major factors effecting properties of a hot-pressed body. These factors must be closely controlled in order to obtain the desired properties in the hot-pressed bodies.

The hot-pressing temperature, which is the most effective parameter for control of product density, is closely related to the doping temperature at which doping slices prepared from the hot-pressed body will be utilized. The desirable maximum doping temperature is approximately 1150°C. In oder to withstand the doping temperature, the doping slice should have a thermal history of hot-pressing at a temperature slightly higher than the doping temperature. Since the melting point of silicon, the primary target for the phosphorus doping sources set forth herein, is about 1400°C, doping temperatures should not exceed 1300°C, in order to avoid mechanical distortion of the silicon wafer due to softening. Further, it has been found that during hot-pressing at 1300°C, $SiP_2O_7$ is melted, resulting in evaporation of phosphorus pentoxide, $P_2O_5$. This evaporation in turn brings about expansion of the body during hot-pressing, and lowers the density of the final hot-pressed body. This evaporation commences at about 1050°C, and can also yield decreased phosphorus content in the hot-pressed body. This decreased phosphorus content should be avoided, by proper control of temperature during hot-pressing.

Thus, it may be seen that the hot-pressing temperature effects phosphorus content, bulk density, and thermal and mechanical stability of the hot-pressed body. If the doping temperature is to be relatively low, the hot-pressing temperature may be relatively low. If doping is to be done at relatively high temperatures, hot-pressing temperatures should also be relatively high. It is desirable that the difference between hot-pressing and doping temperatures should be about 50°C. Therefore, the optimum hot-pressing temperatures range from about 1000°C to 1350°C, dependent upon doping temperatures of from about 950°C to about 1300°C. It is, of course, possible to hot-press at temperatures as low as about 800°C, or as high as about 1450°C, depending upon the specific compositions being utilized.

The soaking or holding time at the maximum hot-pressing temperature should be kept as short as possible in order to minimize phosphorus evaporation. The optimum time is the shortest time sufficient for satisfactory densification, which is generally less than one hour. However, if densification is still proceeding after this time, the time factor may be varied.

Other fabrication factors include atmosphere, heating rate, and cooling conditions. The preferred atmosphere is argon, with industrial grade (approximately 98% pure) argon being suitable. Nitrogen may alternatively be used, since both nitrogen and argon protect the graphite or graphitized carbon mold from oxidation during hot-pressing. Air or vacuum may be used if so desired. The heating rate may be controlled to give a rate of from 20°C to 30°C per minute. At a rate of 27°C per minute, it takes about 45 minutes to reach 1200°C from room temperature, which is adequate to establish a thermal equilibrium between the graphite mold and the compact. After soaking for five minutes (or longer if desirable) the furnace is allowed to cool to room temperature. Pressure is maintained until the temperature drops below about 1000°C.

It has been found that the composition range of silicon pyrophosphate relative to zirconium pyrophosphate may vary widely. While 100 percent silicon pyrophosphate may be used for doping at relatively low temperatures (e.g., 700 to 900°C) this composition is not satisfactory at higher temperatures. First, pure silicon pyrophosphate softens at a relatively low temperature, thus losing structural strength at elevated temperatures. Also, the $P_2O_5$ generation from 100 percent silicon pyrophosphate is relatively rapid, and may cause problems of quantitative control. Accordingly, from 5 to 90 weight percent of zirconium pyrophosphate is used with the silicon pyrophosphate. This additive material serves both as a diluting influence upon $P_2O_5$ generation, and as a structural member at doping temperatures. While silicon pyrophosphate may be present in less than 10 percent proportion, such proportions are economically disadvantageous.

After careful evaluation of many possible additive materials, it has been determined that $ZrP_2O_7$ is particularly suitable for use with $SiP_2O_7$. The principle attributes of $ZrP_2O_7$ include chemical and thermal compatibility with $SiP_2O_7$ and non-reactivity with $P_2O_5$ during decomposition of $SiP_2O_7$; resistance to decomposition to $ZrO_2$ and $P_2O_5$ through temperatures up to about 1400°C; and provision of thermal stability.

Through investigation and experimentation, it has been established that the presence of $Si_2P_2O_9$ [$(SiO_2)_2$·$P_2O_5$] in the doping wafer results in lower softening points and inferior thermal behavior. This compound manifests itself as a pink coloration when fired to about 1100°C, and may be analytically detected by x-ray diffraction. It has been found that $SiP_2O_7$ may be prepared without the formation of undesired $Si_2P_2O_9$ by providing a rich source of $P_2O_5$ during the reaction with the $SiO_2$, and by using a rapid rate of temperature increase to achieve the reaction.

Blends of the finely powdered $SiP_2O_7$ and $ZrP_2O_7$ are formed in the desired proportions. Suitable proportions range from about 10 percent $SiP_2O_7$ and 90 percent $ZrP_2O_7$ to about 95 percent $SiP_2O_7$ and 5 percent $ZrP_2O_7$. A preferred range of proportions is from about 75 percent $SiP_2O_7$/25 percent $ZrP_2O_7$ to about 25 percent $SiP_2O_7$/75 percent $ZrP_2O_7$.

The invention is further illustrated by the following Examples, although it will be understood that the Examples are intended merely for purposes of illustration and are not intended to limit the scope of the invention.

EXAMPLE 1

A dry blend comprising 70 grams of $SiP_2O_7$ and 70 grams $ZrP_2O_7$ is prepared and placed in a 1.50 inch inside diameter graphite mold with fitting plunger. The mold is placed into a container which is disposed within the coil of a high-frequency induction furnace, and the container is covered with a lid. A pressure of about 2,600 pounds per square inch (psi) is applied and maintained on the mold plungers. A stream of argon is introduced continuously into the container through a port therein, the atmosphere of the container being vented through a second port. The power is turned on and the temperature allowed to reach 1200°C as measured by an optical pyrometer. This requires about 45 minutes. This temperature is held substantially constant for 30 minutes, whereupon the power is shut off, and the pressure released when the temperature reaches about 900°C during cooling. During cooling the argon stream is continued, and the system is permitted to cool to room temperature, about five hours being required. The hot-pressed body is ejected from the mold and polished by means of a diamong grinding disc. The body formed is a cylindrical slug nearing approximately 1.50 inches in diameter and 1.685 inches high. This hot-pressed body exhibits no water absorption in a water immersion test, and high mechanical strength.

EXAMPLE 2

In substantial accordance with the procedure set forth in Example 1, slugs of different compositional proportions are prepared by hot-pressing 140 gram batches consisting of $SiP_2O_7$ and $ZrP_2O_7$ at 1150°C and 2600 psi. Bulk densities were measured for each slug prepared.

TABLE I

| SiP$_2$O$_7$ - ZrP$_2$O$_7$ Mixtures | | Bulk Density gram/cc |
|---|---|---|
| Percent SiP$_2$O$_7$ | Percent ZrP$_2$O$_7$ | |
| 25 | 75 | 2.897 |
| 50 | 50 | 2.769 |
| 70 | 30 | 2.667 |
| 75 | 25 | 2.420 |
| 85 | 15 | 2.405 |
| 100 | 0 | 2.427 |

From slugs prepared as in Example 2, solid diffusion sources are fabricated by utilizing conventional means to slice and grind the slugs into thin discs of approximately 0.040 inches thickness and approximately 1.50 inch diameter. These dimensions are established within sufficiently close tolerances to permit accurate comparisons of the diffusion sources in phosphorus doping tests of semiconductor silicon wafers.

Samples made in accordance with this technique are subjected to doping analysis, and produce uniform doping as outlined in the following Example.

EXAMPLE 3

The results of phosphorus doping using solid diffusion sources prepared by the method of Example 1 are determined. The sheet resistance, junction depth, and glass transfer on the doped silicon wafer are measured as a function of time and temperature to demonstrate doping capability.

The diffusion experiments are conducted using 1.50 inch diameter silicon epitaxial wafers which were boron doped and have a resistivity of 1.5 to 2.2 ohm-cm and a film thickness of 8 to 12 microns. The diffusions are conducted in a standard 60 mm inside diameter quartz tube furnace, available from the Thermco Company under the model designation Thermco Brute. A flow of 0.5 liters per minute of nitrogen is established. The positioning of the individual wafers is alternatively, the diffusion carrier having a phosphorus source wafer in every other slot, with two silicon wafers placed back to back spaced 125 mils (3.2 mm) from the source wafers. This type of source positioning within a tube provides a one-to-one correspondence with each silicon wafer. The active component during sourcing is $P_2O_5$, which is transported to the silicon wafer by concentration gradient diffusion. The decomposition reaction is as follows:

$$SiP_2O_7 \rightarrow P_2O_5 + SiO_2.$$

At the silicon wafer surface, a portion of the transported $P_2O_5$ reacts thusly:

$$2 P_2O_5 + 5Si \rightarrow 5 SiO_2 + 4P.$$

The phosphorus thus formed at the surface diffuses into the silicon wafer, while the by-product silica combines with unreacted $P_2O_5$, forming a glass transfer layer.

The source wafers used are approximately 40 mils thick and 1.50 inches in diameter. No chemical cleaning is performed, but prior to diffusion, the source wafers are baked at 345°C for 30 minutes in nitrogen and annealed for 15 minutes in nitrogen at 1100°C.

The sheet resistance is measured using a four-point probe consisting of a linear array with 100 mm spacing and a 200 gram load. All wafers are deglazed using a standard buffered HF solution to remove the $P_2O_5$ surface layer. Sheet resistances are obtained as a function of time for four different doping temperatures, from 950°C to 1100°C in 50°C steps. These results compare favorably with liquid sources such as $POCl_3$ and $PBr_3$.

Junction depth measurements are made using standard angle lapping and straining techniques, using a sodium light to produce interference patterns and counting the fringes to establish depth. Using the sheet resistance and junction depth, a surface concentration may be calculated. The surface concentration thus calculated compares favorably with the solid solubility limit of phosphorus in silicon at these temperatures.

The transfer of $P_2O_5$ in Angstroms as a function of time over the range 950°C to 1100°C is also determined. The silicon test wafers have 4,800 Angstroms of thermal $SiO_2$, on top of which the $P_2O_5$ is deposited during doping. The total glass layer thickness is measured, and 4,800 Angstroms subtracted to obtain the actual $P_2O_5$ glass transfer. Thickness measurements are made using UV-Visible reflectance techniques.

Solid diffusion sources are prepared in accordance with Example 2, using varying $SiP_2O_7$ concentrations. Phosphorus doping tests using these sources are conducted at a doping temperature of 1100°C, for one hour. Results of these tests are illustrated in Table II.

TABLE II

| Results of Doping Tests Using SiP$_2$O$_7$-ZrP$_2$O$_7$ Sources | | | | |
|---|---|---|---|---|
| Composition SiP$_2$O$_7$ | (Wt.%) ZrP$_2$O$_7$ | Sheet Resistance (ohms/square) | Junction depth (Microns) | Glass Transfer (Angstrom Units) |
| 50 | 50 | 1.5 | 2.74 | 4.12 |
| 75 | 25 | 1.5 | 2.25 | 3.33 |

While the invention has been described herein with reference to certain preferred embodiments, it is to be understood that various changes and modifications may be made by those skilled in the art without departing from the concept of the invention, the scope of which is to be determined by reference to the following claims.

What is claimed is:

1. A method for producing a solid phosphorus containing source body for semiconductor diffusion doping treatment comprising:
   a. filling a mold with a powder comprising $SiP_2O_7$ and $ZrP_2O_7$,
   b. hot-pressing the powder in the mold, and
   c. cooling and removing the phosphorus containing source body.

2. A method for making a solid phosphorus containing source body according to claim 1 in which the hot-pressing is done at a temperature ranging from about 800 to about 1450°C and pressures ranging from about 750 to about 6000 psi.

3. A method for making a solid phosphorus containing source body according to claim 1 in which the powder is hot-pressed at a temperature of about 1200°C under a pressure of about 2600 psi for about a 30-minute time period.

* * * * *

UNITED STATES PATENT OFFICE
CERTIFICATE OF CORRECTION

Patent No. 3,954,525          Dated MAY 4, 1976

Inventor(s) THOMAS A. MYLES and CURTIS E. ZIMMER

It is certified that error appears in the above-identified patent and that said Letters Patent are hereby corrected as shown below:

On the front page and in Column 1, lines 1-2, the title should read -- HOT-PRESSED SOLID DIFFUSION SOURCES FOR PHOSPHORUS DOPING --.

Column 3, line 25, "oder" should read -- order --.

Column 5, line 15, "diamong" should read -- diamond --.

Signed and Sealed this

Tenth Day of August 1976

[SEAL]

*Attest:*

RUTH C. MASON
*Attesting Officer*

C. MARSHALL DANN
*Commissioner of Patents and Trademarks*